US012777821B2

(12) United States Patent
Hong et al.

(10) Patent No.: US 12,777,821 B2
(45) Date of Patent: Oct. 27, 2026

(54) DISPLAY DEVICE

(71) Applicant: LG Display Co., Ltd., Seoul (KR)

(72) Inventors: Seungpyo Hong, Busan (KR); SeungHee Nam, Paju-si (KR); JungSun Baek, Paju-si (KR); Yongmin Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 351 days.

(21) Appl. No.: 18/528,467

(22) Filed: Dec. 4, 2023

(65) Prior Publication Data

US 2024/0224735 A1 Jul. 4, 2024

(30) Foreign Application Priority Data

Dec. 29, 2022 (KR) ........................ 10-2022-0188529

(51) Int. Cl.

*H10K 59/80* (2023.01)
*G09G 3/3225* (2016.01)
*H10K 59/124* (2023.01)
*H10K 59/35* (2023.01)

(52) U.S. Cl.

CPC ......... *H10K 59/875* (2023.02); *G09G 3/3225* (2013.01); *H10K 59/124* (2023.02); *H10K 59/35* (2023.02); *G09G 2300/0842* (2013.01)

(58) Field of Classification Search

None
See application file for complete search history.

(56) References Cited

U.S. PATENT DOCUMENTS

| | | | | |
|---|---|---|---|---|
| 2015/0115253 | A1* | 4/2015 | Ha | H10K 50/813 438/23 |
| 2018/0331325 | A1 | 11/2018 | Zhang | |
| 2020/0194713 | A1* | 6/2020 | Kim | H10K 50/818 |
| 2020/0203447 | A1* | 6/2020 | Lee | H10K 59/80515 |
| 2021/0132723 | A1 | 5/2021 | Kim et al. | |

FOREIGN PATENT DOCUMENTS

| | | |
|---|---|---|
| KR | 10-2075728 B1 | 2/2020 |
| KR | 10-2021-0054390 A | 5/2021 |

* cited by examiner

*Primary Examiner* — Jay C Chang

(74) *Attorney, Agent, or Firm* — Birch, Stewart, Kolasch & Birch, LLP

(57) ABSTRACT

A display device can include a first light emitting area, a second light emitting area positioned outside the first light emitting area and positioned to be spaced apart from the first light emitting area, a third light emitting area positioned outside the second light emitting area and continuously positioned in contact with the second light emitting area, a second non-light emitting area positioned between the first light emitting area and the second light emitting area, and a first non-light emitting area positioned outside the third light emitting area. As a result, the display device is capable of maximally suppressing a change in color coordinates even at a wide viewing angle.

15 Claims, 7 Drawing Sheets

DISPLAY DEVICE

CROSS-REFERENCE TO RELATED APPLICATION

This application claims priority to Korean Patent Application No. 10-2022-0188529, filed in the Republic of Korea on Dec. 29, 2022, the entire contents of which are hereby expressly incorporated by reference into the present application.

BACKGROUND

Field

Embodiments of the present disclosure relate to a display device.

Discussion of the Related Art

A display device which displays various information on a screen is a key technology in the era of information and communication technology, and serves to deliver various information to users.

In the display device, excellent display quality and luminous efficiency are needed. In particular, a display device is needed, which can maintain excellent display quality even when an angle at which a user views a screen changes. That is to say, the display device is needed to maintain excellent display quality even at a wide viewing angle.

The display device can include light emitting elements which emit light of different colors to express various colors. However, since the light emitting elements which emit light of different colors have different element characteristics, it may be difficult to maintain uniform display quality even at a wide viewing angle.

As a viewing angle for the display area of the display device increases, a limitation can arise in that color coordinates change. In particular, when the display device includes light emitting elements which emit light of different colors, a degree of degradation in display quality according to a viewing angle of one type of light emitting element can be greater than those of the other light emitting elements, which can cause non-uniformity to occur.

SUMMARY OF THE DISCLOSURE

To address the limitations and issues associated with the related art, the inventors of the present disclosure have invented an improved display device including a first light emitting area, a second light emitting area and a third light emitting area, thereby being capable of maximally suppressing a change in color coordinates even at a wide viewing angle.

Embodiments of the present disclosure can provide a display device including a first light emitting area, a second light emitting area, a third light emitting area, and one or more non-light emitting areas, which can provide excellent uniform display quality at wide viewing angles.

Embodiments of the present disclosure can provide a display device including a planarization layer including a concave portion, a first sloped surface and a second sloped surface, an anode electrode positioned on the planarization layer and a light emitting layer positioned on the anode electrode, thereby being capable of maximally suppressing a change in color coordinates even at a wide viewing angle.

Embodiments of the present disclosure can provide a display device including a first light emitting area, a second light emitting area, a third light emitting area, a first non-light emitting area and a second non-light emitting area.

The second light emitting area can be positioned outside the first light emitting area, and can be positioned to be spaced apart from the first light emitting area.

The third light emitting area can be positioned outside the second light emitting area, and can be continuously positioned in contact with the second light emitting area.

The second non-light emitting area can be positioned between the first light emitting area and the second light emitting area.

The first non-light emitting area can be positioned outside the third light emitting area.

Embodiments of the present disclosure can provide a display device including a planarization layer, an anode electrode positioned on the planarization layer and a light emitting layer positioned on the anode electrode.

The planarization layer can include a concave portion, a first sloped surface and a second sloped surface. The first sloped surface can be positioned outside the concave portion, and the second sloped surface can be positioned outside the first sloped surface.

According to the embodiments of the present disclosure, it is possible to provide a display device including a first light emitting area, a second light emitting area and a third light emitting area, thereby being capable of maximally suppressing a change in color coordinates even at a wide viewing angle.

According to the embodiments of the present disclosure, it is possible to provide a display device including a planarization layer including a concave portion, a first sloped surface and a second sloped surface, an anode electrode positioned on the planarization layer and a light emitting layer positioned on the anode electrode, thereby having improved light efficiency while being capable of maximally suppressing a change in color coordinates even at a wide viewing angle.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION OF THE EMBODIMENTS

Figure 1:
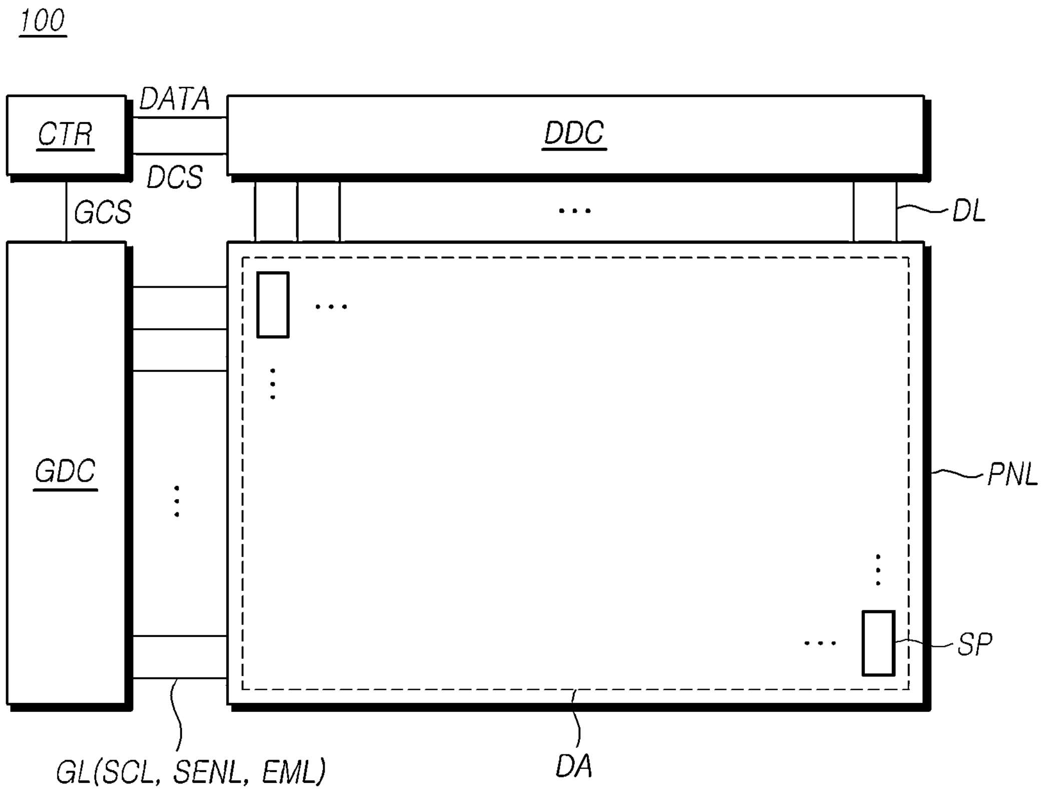
FIG. 1 is a system configuration diagram of a display device in accordance with embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description can make the subject matter in some embodiments of the present disclosure rather unclear. The terms such as “including”, “having”, “containing”, “constituting” “make up of”, and “formed of” used herein are generally intended to allow other components to be added unless the terms are used with the term “only”. As used herein, singular forms are intended to include plural forms unless the context clearly indicates otherwise.

Terms, such as “first”, “second”, “A”, “B”, “(A)”, or “(B)” can be used herein to describe elements of the present disclosure. Each of these terms is not used to define essence, order, sequence, or number of elements etc., but is used merely to distinguish the corresponding element from other elements.

When it is mentioned that a first element “is connected or coupled to”, “contacts or overlaps” etc. a second element, it should be interpreted that, not only can the first element “be directly connected or coupled to” or “directly contact or overlap” the second element, but a third element can also be “interposed” between the first and second elements, or the first and second elements can “be connected or coupled to”, “contact or overlap”, etc. each other via a fourth element. Here, the second element can be included in at least one of two or more elements that “are connected or coupled to”, “contact or overlap”, etc. each other.

When time relative terms, such as “after,” “subsequent to,” “next,” “before,” and the like, are used to describe processes or operations of elements or configurations, or flows or steps in operating, processing, manufacturing methods, these terms can be used to describe non-consecutive or non-sequential processes or operations unless the term “directly” or “immediately” is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term “may” fully encompasses all the meanings of the term “can”.

Hereinafter, various embodiments of the present disclosure will be described in detail with reference to accompanying drawings. All the components of each display device according to all embodiments of the present disclosure are operatively coupled and configured.

FIG. 1 is a system configuration diagram of an organic light emitting display device 100 in accordance with embodiments of the present disclosure.

Referring to FIG. 1, the organic light emitting display device 100 in accordance with the embodiments of the present disclosure can include a display panel PNL in which a plurality of data lines DL and a plurality of gate lines GL are disposed and a plurality of subpixels SP connected to the plurality of data lines DL and the plurality of gate lines GL are arranged in a display area DA (active area), and a driving circuit for driving the display panel PNL.

From a functional point of view, the driving circuit can include a data driving circuit DDC which drives the plurality of data lines DL, a gate driving circuit GDC which drives the plurality of gate lines GL, and a controller CTR which controls the data driving circuit DDC and the gate driving circuit GDC.

In the display panel PNL, the plurality of data lines DL and the plurality of gate lines GL can be disposed to intersect with each other. For example, the plurality of data lines DL can be disposed in columns or rows, and the plurality of gate lines GL can be disposed in rows or columns. Hereinbelow, for the sake of convenience in explanation, it is assumed that the plurality of data lines DL are disposed in columns and the plurality of gate lines GL are arranged in rows.

The controller CTR supplies various control signals DCS and GCS needed for the driving operations of the data driving circuit DDC and the gate driving circuit GDC, thereby controlling the data driving circuit DDC and the gate driving circuit GDC.

The controller CTR starts scan according to a timing implemented in each frame, converts input image data inputted from the outside to be suitable for a data signal format used in the data driving circuit DDC, outputs converted image data DATA, and controls data driving at an appropriate time in correspondence to the scan.

The controller CTR can be either a timing controller which is used in a typical display technology or a control device which includes a timing controller. The controller CTR is capable of further performing other control functions.

The controller CTR can be implemented as a component separate from the data driving circuit DDC, or can be implemented as an integrated circuit by being incorporated with the data driving circuit DDC.

The data driving circuit DDC receives the image data DATA from the controller CTR and supplies data voltages to the plurality of data lines DL, thereby driving the plurality of data lines DL. The data driving circuit DDC is also referred to as a source driving circuit.

The data driving circuit DDC can be implemented by including at least one source-driver integrated circuit (S-DIC). Each source-driver integrated circuit (S-DIC) can include a shift register, a latch circuit, a digital-to-analog converter (DAC), an output buffer, and so forth. As the case can be, each source-driver integrated circuit (S-DIC) can further include an analog-to-digital converter (ADC).

Each source-driver integrated circuit (S-DIC) can be connected to bonding pads of the display panel PNL in a tape automated bonding (TAB) method or a chip-on-glass (COG) method, or can be directly disposed in the display panel PNL. As the case can be, each source-driver integrated circuit (S-DIC) can be disposed in the display panel PNL by being integrated thereinto. Alternatively, each source-driver integrated circuit (S-DIC) can be implemented in a chip-on-film (COF) method in which the source-driver integrated circuit (S-DIC) is mounted on a source-circuit film connected to the display panel PNL.

The gate driving circuit GDC sequentially supplies scan signals to the plurality of gate lines GL, thereby sequentially driving the plurality of gate lines GL. The gate driving circuit GDC is also referred to as a scan driving circuit.

The gate driving circuit (GDC) can be connected to bonding pads of the display panel PNL in a tape automated bonding (TAB) method or a chip-on-glass (COG) method, or can be directly disposed in the display panel PNL by being implemented in a gate-in-panel (GIP) type. As the case can be, the gate driving circuit GDC can be disposed in the display panel PNL by being integrated thereinto. Alternatively, the gate driving circuit (GDC) can be implemented by a plurality of gate driver integrated circuits (G-DIC) to be implemented in a chip-on-film (COF) method in which the gate driving circuit (GDC) is mounted on a gate-circuit film connected to the display panel PNL.

The gate driving circuit GDC sequentially supplies scan signals of an on voltage or an off voltage to the plurality of gate lines GL under the control of the controller CTR.

When a specific gate line GL is open by the gate driving circuit GDC, the data driving circuit DDC converts the image data DATA received from the controller CTR into analog type data voltages, and supplies the data voltages to the plurality of data lines DL.

The data driving circuit DDC can be located on only one side (e.g., the top side or the bottom side) of the display panel PNL. As the case can be, the data driving circuit DDC can be located on both sides (e.g., the top side and bottom side) of the display panel PNL depending on a driving method, a panel design method, etc.

The gate driving circuit GDC can be located on only one side (e.g., the left side or the right side) of the display panel PNL. As the case can be, the gate driving circuit GDC can be located on both sides (e.g., the left side and right side) of the display panel PNL depending on a driving method, a panel design method, etc.

The plurality of gate lines GL disposed in the display panel PNL can include a plurality of scan lines SCL, a plurality of sense lines SENL and a plurality of emission control lines EML. The scan lines SCL, the sense lines SENL and the emission control lines EML are lines which transfer different types of gate signals (scan signals, sense signals and emission control signals) to gate nodes of different types of transistors (scan transistors, sense transistors and emission control transistors).

Figure 2:
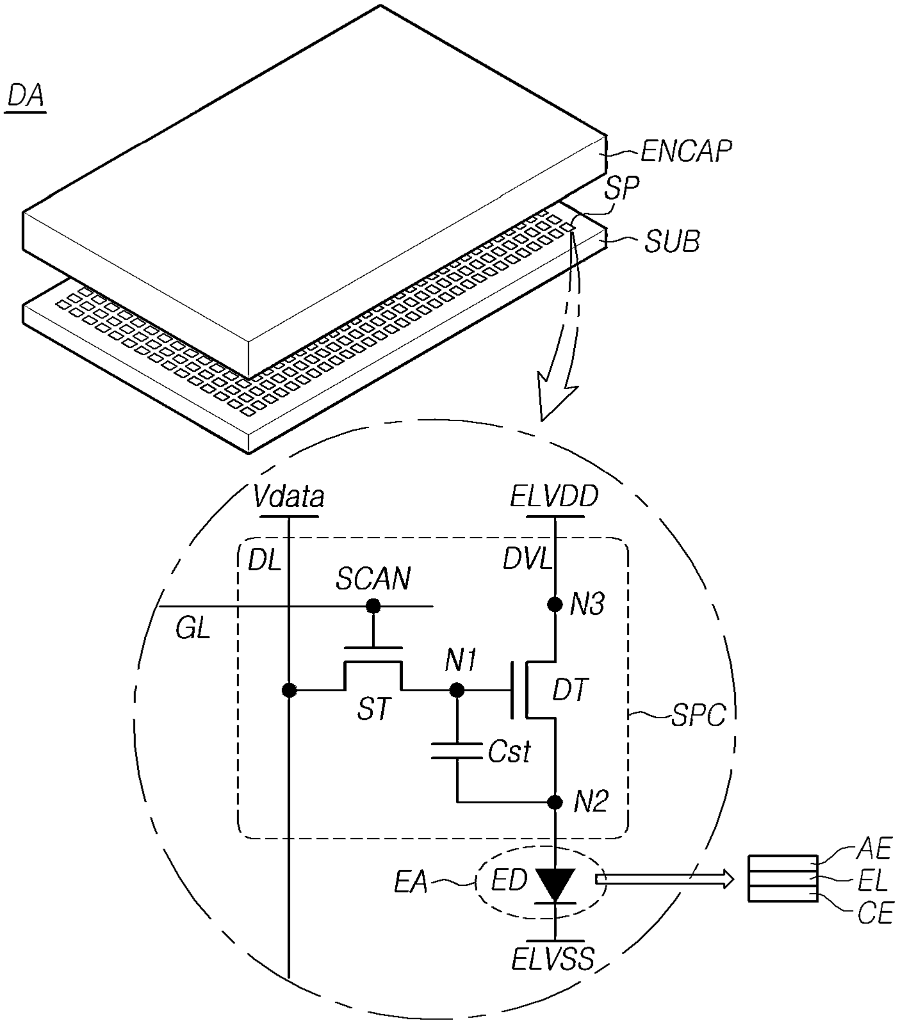
FIG. 2 illustrates a schematic cross-sectional structure of the display device and a circuit diagram of a subpixel in accordance with the embodiments of the present disclosure.

FIG. 2 illustrates a schematic cross-sectional structure of the display device and a circuit diagram of a subpixel in accordance with the embodiments of the present disclosure. The structure of FIG. 2 can be applied to the display device of FIG. 1 or other figures/embodiments of the present disclosure.

Referring to FIG. 2, a plurality of subpixels SP can be disposed on a substrate SUB in a display area DA. The plurality of subpixels SP can be disposed in a normal area, a first optical area and a second optical area included in the display area DA.

Referring to FIG. 2, each of the plurality of subpixels SP can include a light emitting element ED and a subpixel circuit unit SPC configured to drive the light emitting element ED.

Referring to FIG. 2, the subpixel circuit unit SPC can include a driving transistor DT for driving the light emitting element ED, a scan transistor ST for transferring a data voltage Vdata to a first node N1 of the driving transistor DT, and a storage capacitor Cst for maintaining a constant voltage during one frame.

The driving transistor DT can include the first node N1 to which the data voltage Vdata can be applied, a second node N2 which is electrically connected to the light emitting element ED and a third node N3 to which a driving voltage ELVDD from a driving voltage line DVL is applied. In the driving transistor DT, the first node N1 can be a gate node, the second node N2 can be a source node or a drain node, and the third node N3 can be a drain node or a source node. Hereinbelow, for the sake of convenience in explanation, it will be exemplified that, in the driving transistor DT, the first node N1 is a gate node, the second node N2 is a source node and the third node N3 is a drain node.

The light emitting element ED can include an anode electrode AE, a light emitting layer EL and a cathode electrode CE. The anode electrode AE can be a pixel electrode which is disposed in each subpixel SP, and can be electrically connected to the second node N2 of the driving transistor DT of each subpixel SP. The cathode electrode CE can be a common electrode which is disposed in common in the plurality of subpixels SP, and a base voltage ELVSS can be applied to the cathode electrode CE.

For example, the anode electrode AE can be a pixel electrode, and the cathode electrode CE can be a common electrode. Conversely, the anode electrode AE can be a common electrode, and the cathode electrode CE can be a pixel electrode. Hereinbelow, for the sake of convenience in explanation, it is assumed that the anode electrode AE is a pixel electrode and the cathode electrode CE is a common electrode.

The light emitting element ED can have a predetermined light emitting area EA, and the light emitting area EA of the light emitting element ED can be defined as an area where the anode electrode AE, the light emitting layer EL and the cathode electrode CE overlap.

For example, the light emitting element ED can be an organic light emitting diode (OLED), an inorganic light emitting diode or a quantum dot light emitting element. When the light emitting element ED is an organic light emitting diode, the light emitting layer EL in the light emitting element ED can include an organic light emitting layer EL which includes an organic material.

The scan transistor ST can be on-off controlled by a scan signal SCAN which is a gate signal applied through a gate line GL, and can be electrically connected between the first node N1 of the driving transistor DT and the data line DL.

The storage capacitor Cst can be electrically connected between the first node N1 and the second node N2 of the driving transistor DT.

As illustrated in FIG. 2, the subpixel circuit unit SPC can have a 2T (transistor) 1C (capacitor) structure including two transistors DT and ST and one capacitor Cst. As the case can be, the subpixel circuit unit SPC can further include at least one transistor or at least one capacitor.

The storage capacitor Cst may not be a parasitic capacitor (e.g., Cgs or Cgd) which is an internal capacitor existing between the first node N1 and the second node N2 of the driving transistor DT, but can be an external capacitor which is intentionally designed outside the driving transistor DT. Each of the driving transistor DT and the scan transistor ST can be an n-type transistor or a p-type transistor.

Because circuit elements (in particular, the light emitting element ED implemented as an organic light emitting diode (OLED) including an organic material) in each subpixel SP can be vulnerable to external moisture or oxygen, an encapsulation layer ENCAP for preventing external moisture or oxygen from penetrating into the circuit elements (in particular, the light emitting element ED) can be disposed. The encapsulation layer ENCAP can be disposed in a pattern that covers light emitting elements ED.

Figure 3:
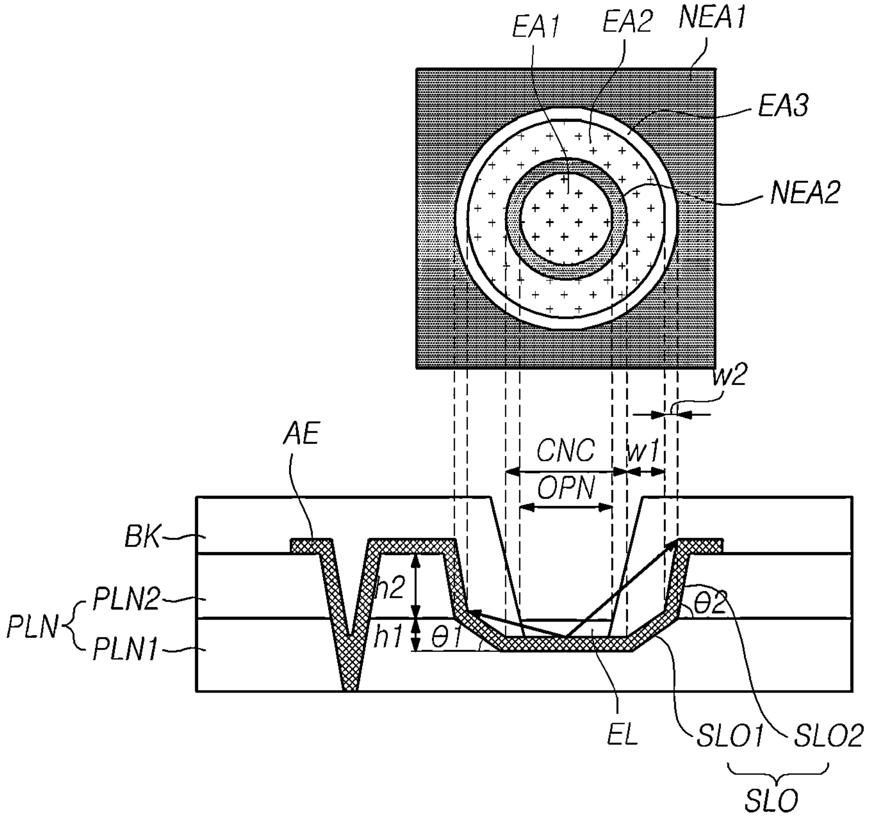
FIGS. 3 and 4 are cross-sectional views (bottom portion) and plan views (top portion) of subpixels of the display device in accordance with the embodiments of the present disclosure.

FIG. 3 is a cross-sectional view (bottom part) and a plan view (top part) of a subpixel of the display device in accordance with the embodiments of the present disclosure. In detail, FIG. 3 is a cross-sectional view and a plan view of one subpixel, and the plan view of FIG. 3 is a plan view illustrating a light emitting area which appears when the subpixel is driven.

Referring to FIG. 3, the display device can include a first light emitting area EA1, a second light emitting area EA2, a third light emitting area EA3, a first non-light emitting area NEA1 and a second non-light emitting area NEA2.

The first light emitting area EA1 can be a main light emitting area of the subpixel. The luminance of the first light emitting area EA1 can be larger than the luminance of the second light emitting area EA2 and the luminance of the third light emitting area EA3.

The first light emitting area EA1 can be positioned in correspondence to a concave portion CNC of a planarization layer PLN. The first light emitting area EA1 can be defined by a bank BK. That is to say, the first light emitting area EA1 can be substantially the same as an opening OPN of the bank BK.

The second light emitting area EA2 can be positioned outside the first light emitting area EA1. The fact that the second light emitting area EA2 is positioned outside the first light emitting area EA1 can mean, e.g., that the second light emitting area EA2 is positioned at the periphery of the first light emitting area EA1 or is positioned to surround the first light emitting area EA1.

The second light emitting area EA2 can be positioned to be spaced apart from the first light emitting area EA1. The fact that the second light emitting area EA2 is positioned to be spaced apart from the first light emitting area EA1 can mean, e.g., a case where the second light emitting area EA2 is completely spaced apart from the first light emitting area EA1 not to contact with each other and a case where the second light emitting area EA2 is partially spaced apart from the first light emitting area EA1.

The second light emitting area EA2 can have a shape corresponding to the shape of the edge of the first light emitting area EA1.

The third light emitting area EA3 can be positioned outside the second light emitting area EA2. The fact that the third light emitting area EA3 is positioned outside the second light emitting area EA2 can preferably mean, e.g., that the third light emitting area EA3 is positioned at the periphery of the second light emitting area EA2 or is positioned to surround the second light emitting area EA2, but other variations are possible.

The third light emitting area EA3 can be continuously positioned in contact with the second light emitting area EA2. The fact that the third light emitting area EA3 is continuously positioned in contact with the second light emitting area EA2 can mean, e.g., that the third light emitting area EA3 is not partially spaced apart from the second light emitting area EA2 and the third light emitting area EA3 and the second light emitting area EA2 are connected with each other to be continuously positioned.

The third light emitting area EA3 can have a shape corresponding to the shape of the edge of the second light emitting area EA2.

The second non-light emitting area NEA2 can be positioned between the first light emitting area EA1 and the second light emitting area EA2. The first non-light emitting area NEA1 can be positioned outside the third light emitting area EA3.

The first light emitting area EA1, the second light emitting area EA2, the third light emitting area EA3 and the second non-light emitting area NEA2 can be positioned in the same one subpixel. The first non-light emitting area NEA1 can be positioned in an area corresponding to a plurality of subpixels.

The display device in accordance with the embodiments of the present disclosure can have excellent viewing angle characteristics by including the second light emitting area EA2 and the third light emitting area EA3 in addition to the first light emitting area EA1 which is a main light emitting area.

A width w1 of the second light emitting area EA2 can be larger than a width w2 of the third light emitting area EA3. When the width w1 of the second light emitting area EA2 is larger than the width w2 of the third light emitting area EA3, an angle θ2 formed by a second sloped surface SLO2 and the light emitting layer EL can be larger than an angle θ1 formed between a first sloped surface SLO1 and the light emitting layer EL. A height h2 of the second sloped surface SLO2 can be larger than a height h1 of the first sloped surface SLO1. As a result, since the anode electrode AE can more effectively reflect light emitted from the light emitting layer EL, the display device can have excellent viewing angle characteristics. In the present disclosure, the height of the first sloped surface SLO1 can mean, e.g., the height of the first sloped surface SLO1 in a vertical direction on the basis of the concave portion CNC, and the height of the second sloped surface SLO2 can mean, e.g., the height of the second sloped surface SLO2 in the vertical direction on the basis of a point where the second sloped surface SLO2 starts. The "vertical direction" can mean, e.g., a direction perpendicular to the plane of the display area of the display device.

The area of the second light emitting area EA2 can be larger than the area of the third light emitting area EA3. When the area of the second light emitting area EA2 is larger than the area of the third light emitting area EA3, the angle θ2 formed by the second sloped surface SLO2 and the light emitting layer EL can be larger than the angle θ1 formed between the first sloped surface SLO1 and the light emitting layer EL. The height h2 of the second sloped surface SLO2 can be larger than the height h1 of the first sloped surface SLO1. As a result, since the anode electrode AE can more effectively reflect light emitted from the light emitting layer EL, the display device can have excellent viewing angle characteristics.

The luminance of the third light emitting area EA3 can be larger than the luminance of the second light emitting area EA2. When the luminance of the third light emitting area EA3 is larger than the luminance of the second light emitting area EA2, the angle θ2 formed by the second sloped surface SLO2 and the light emitting layer EL can be larger than the angle θ1 formed between the first sloped surface SLO1 and the light emitting layer EL. The height h2 of the second sloped surface SLO2 can be larger than the height h1 of the first sloped surface SLO1. As a result, since the anode electrode AE can more effectively reflect light emitted from the light emitting layer EL, the display device can have excellent viewing angle characteristics.

The display device can include the planarization layer PLN, the anode electrode AE positioned on the planarization layer PLN and the light emitting layer EL positioned on the anode electrode AE.

The planarization layer PLN can include the concave portion CNC, the first sloped surface SLO1 and the second sloped surface SLO2. The first sloped surface SLO1 can be positioned outside the concave portion CNC. The second sloped surface SLO2 can be positioned outside the first sloped surface SLO1. Since the planarization layer PLN includes the first sloped surface SLO1 and the second sloped surface SLO2, the display device can have excellent viewing angle characteristics. In addition, since the second sloped surface SLO2 is positioned outside the first sloped surface SLO1, the display device can have more excellent viewing angle characteristics.

The second light emitting area EA2 can be positioned in correspondence to the first sloped surface SLO1. The fact that the second light emitting area EA2 is positioned in correspondence to the first sloped surface SLO1 can mean, e.g., that the second light emitting area EA2 is positioned in an area where the first sloped surface SLO1 is positioned in the plane of the display area. The second light emitting area EA2 can be an area where light reflected from a portion of the anode electrode AE positioned on the first sloped surface SLO1 is emitted. Further, it can be meant, e.g., that the width w1 of the second light emitting area EA2 is the same as the width w1 of the first sloped surface SLO1.

The third light emitting area EA3 can be positioned in correspondence to the second sloped surface SLO2. The fact that the third light emitting area EA3 is positioned in correspondence to the second sloped surface SLO2 can mean, e.g., that the third light emitting area EA3 is positioned in an area where the second sloped surface SLO2 is positioned in the plane of the display area. The third light emitting area EA3 can be an area where light reflected from a portion of the anode electrode AE positioned on the second sloped surface SLO2 is emitted. Further, it can be meant, e.g., that the width w2 of the third light emitting area EA3 is the same as the width w2 of the second sloped surface SLO2.

The angle θ2 formed between the second sloped surface SLO2 and the light emitting layer EL can be larger than the angle θ1 formed between the first sloped surface SLO1 and the light emitting layer EL. When the angle θ2 formed between the second sloped surface SLO2 and the light emitting layer EL is larger than the angle θ1 formed between the first sloped surface SLO1 and the light emitting layer EL, the height h2 of the second sloped surface SLO2 can be larger than the height h1 of the first sloped surface SLO1. As a result, since the anode electrode AE can more effectively reflect light emitted from the light emitting layer EL, the display device can have excellent viewing angle characteristics.

The planarization layer PLN, as a layer for planarizing various circuit elements such as transistors and a capacitor for driving the light emitting element of a subpixel and signal lines such as a data line and a gate line, can be an insulating layer which is positioned between the light emitting element and a thin film transistor array. The planarization layer PLN can be a single layer or multiple layers.

The planarization layer PLN can include a first planarization layer PLN1 and a second planarization layer PLN2 which is positioned on the first planarization layer PLN1. The first planarization layer PLN1 can include the first sloped surface SLO1, and the second planarization layer PLN2 can include the second sloped surface SLO2. When the planarization layer PLN includes the first planarization layer PLN1 including the first sloped surface SLO1 and the second planarization layer PLN2 including the second sloped surface SLO2, the first sloped surface SLO1 and the second sloped surface SLO2 having the different taper angles θ1 and θ2 can be more easily formed.

The height h2 of the second sloped surface SLO2 can be larger than the height h1 of the first sloped surface SLO1. When the second sloped surface SLO2 positioned outside the first sloped surface SLO1 has a height larger than the first sloped surface SLO1, the anode electrode AE can more effectively reflect light generated from the light emitting layer EL, and thus, the display device can have excellent viewing angle characteristics.

Figure 4:
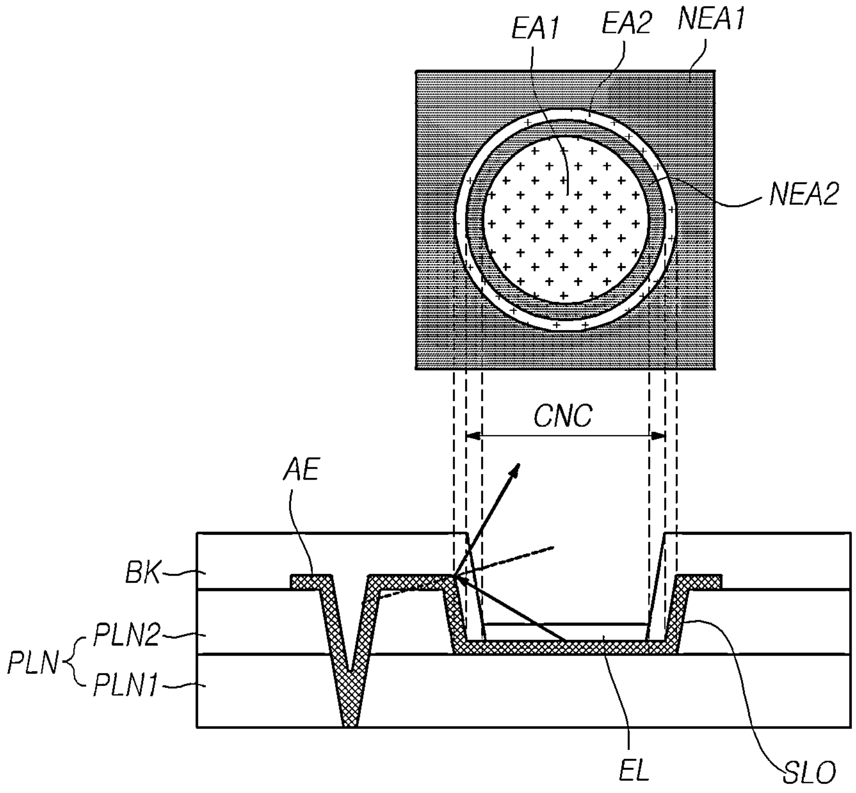

FIG. 4 is a cross-sectional view and a plan view of a subpixel of the display device in accordance with the embodiments of the present disclosure. In detail, FIG. 4 is a cross-sectional view of a subpixel different from the subpixel illustrated in FIG. 3, and the subpixel of FIG. 4 can be a subpixel which emits light of a different color from the subpixel illustrated in FIG. 3. Hereinafter, the subpixel illustrated in FIG. 3 can be referred to as a first subpixel, and the subpixel illustrated in FIG. 4 can be referred to as a second subpixel. In describing the display device illustrated in FIG. 4, the description of a component which is not specifically described otherwise can be the same as the description of the corresponding component of the display device illustrated in FIG. 3.

Referring to FIG. 4, the second subpixel can include a first light emitting area EA1, a second light emitting area EA2, a first non-light emitting area NEA1 and a second non-light emitting area NEA2.

The second light emitting area EA2 can be positioned outside the first light emitting area EA1, and can be positioned to be spaced apart from the first light emitting area EA1. The second non-light emitting area NEA2 can be positioned between the first light emitting area EA1 and the second light emitting area EA2. The luminance of the first light emitting area EA1 can be higher than the luminance of the second light emitting area EA2. The color coordinates of the first light emitting area EA1 can be different from the color coordinates of the second light emitting area EA2.

A planarization layer PLN can include a sloped surface SLO. Unlike the subpixel illustrated in FIG. 3, the sloped surface SLO can include only one sloped surface. For example, the planarization layer PLN can include a first planarization layer PLN1 and a second planarization layer PLN2 which is positioned on the first planarization layer PLN1, and the second planarization layer PLN2 can include the sloped surface SLO.

The first light emitting area EA1 can be positioned in correspondence to a concave portion CNC of the planarization layer PLN. The second light emitting area EA2 can be positioned in correspondence to the sloped surface SLO.

As described above, the first subpixel and the second subpixel illustrated in FIG. 3 and FIG. 4 can include the sloped surfaces SLO which have different shapes. For example, the first subpixel can have a double sloped surface structure in which the sloped surface SLO includes the first sloped surface SLO1 and the second sloped surface SLO2, and the second subpixel can have a single sloped surface structure in which the sloped surface SLO includes the one sloped surface. When different sloped surface (SLO) structures are applied to subpixels which have different optical characteristics by emitting light of different colors, the display device can maintain more uniform viewing angle characteristics according to various viewing angles.

Figure 5:
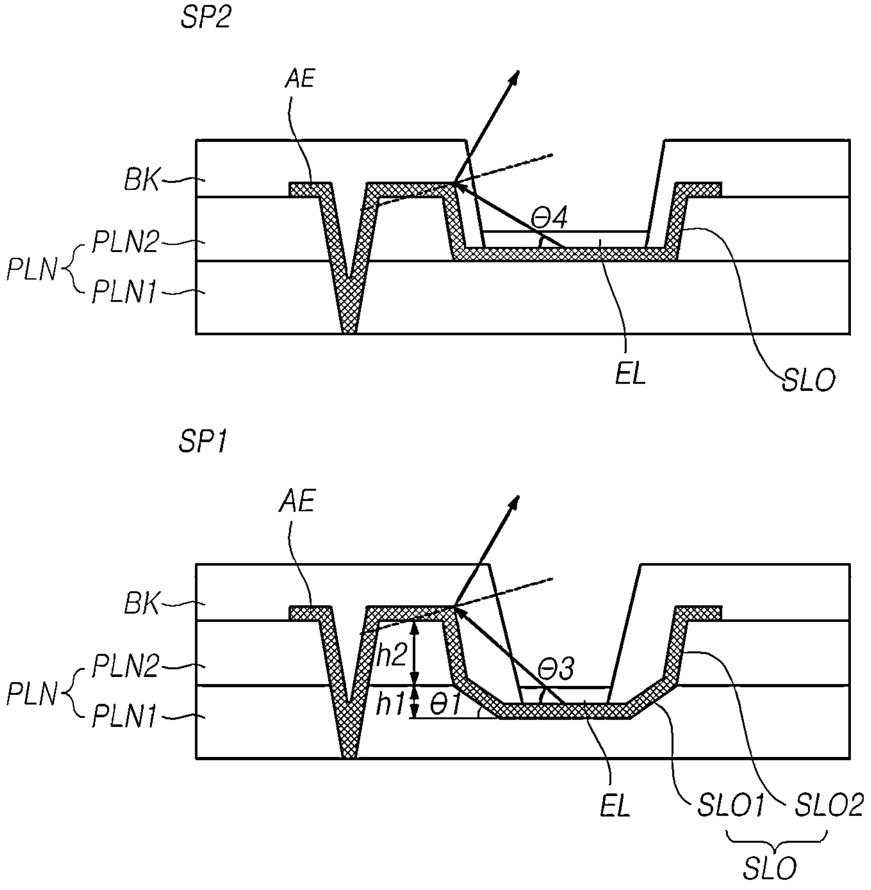
FIG. 5 shows cross-sectional views of subpixels of the display device in accordance with the embodiments of the present disclosure.

FIG. 5 is of cross-sectional views of subpixels of the display device in accordance with the embodiments of the present disclosure. In detail, FIG. 5 is a cross-sectional view of the first subpixel and the second subpixel illustrated in FIG. 3 and FIG. 4, respectively.

Referring to FIG. 5, in a first subpixel SP1, the sloped surface SLO can have the double sloped surface structure, and in a second subpixel SP2, the sloped surface SLO can have the single sloped surface structure. In the first subpixel SP1, a third angle θ3 is a maximum angle at which light emitted from the light emitting layer EL can be reflected from the anode electrode AE. In the second subpixel SP2, a fourth angle θ4 is a maximum angle at which light emitted from the light emitting layer EL can be reflected from the anode electrode AE. Since the third angle θ3 is larger than the fourth angle θ4, light emitted through a larger viewing angle in a sideward direction can be reflected in the second subpixel SP2. Accordingly, the single sloped surface structure or the double sloped surface structure can be selectively applied according to element characteristics of a light emitting element included in a subpixel.

Figure 6:
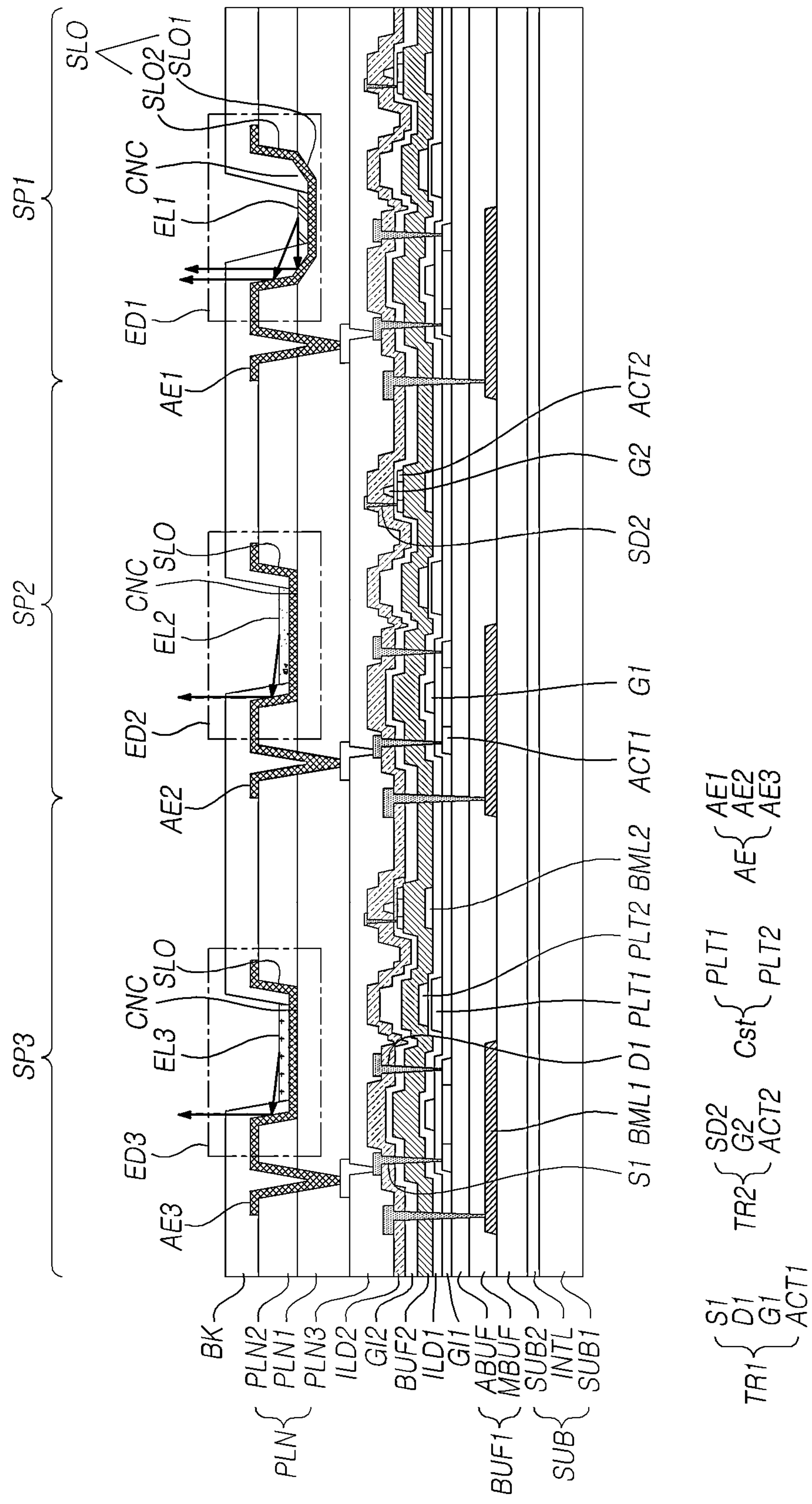
FIGS. 6 and 7 are cross-sectional views of display devices in accordance with embodiments of the present disclosure.

FIG. 6 is a cross-sectional view of a display device in accordance with embodiments of the present disclosure.

Referring to FIG. 6, the display device can include a first subpixel SP1 which emits blue light, a second subpixel SP2 which emits green light and a third subpixel SP3 which emits red light. However, other variations are possible.

Referring to FIG. 3 and FIG. 6, the first subpixel SP1 can include the above-described double sloped surface structure. Accordingly, the first subpixel SP1 can include the first light emitting area EA1, the second light emitting area EA2, the third light emitting area EA3, the first non-light emitting area NEA1 and the second non-light emitting area NEA2 described above with reference to FIG. 3.

The first subpixel SP1 can include a first light emitting element ED1. The first light emitting element ED1 can include a first anode electrode AE1 and a first light emitting layer EL1. The first light emitting layer EL1 can be a light emitting layer which emits blue light.

In the first subpixel SP1, a planarization layer PLN can include a concave portion CNC, a first sloped surface SLO1 which is positioned outside the concave portion CNC and a second sloped surface SLO2 which is positioned outside the first sloped surface SLO1.

The second subpixel SP2 can include a second light emitting element ED2. The second light emitting element ED2 can include a second anode electrode AE2 and a second light emitting layer EL2. The second light emitting layer EL2 can be a light emitting layer which emits green light.

In the second subpixel SP2, the planarization layer PLN can include a concave portion CNC and a sloped surface SLO which is positioned outside the concave portion CNC.

The third subpixel SP3 can include a third light emitting element ED3. The third light emitting element ED3 can include a third anode electrode AE3 and a third light emitting layer EL3. The third light emitting layer EL3 can be a light emitting layer which emits red light.

In the third subpixel SP3, the planarization layer PLN can include a concave portion CNC and a sloped surface SLO which is positioned outside the concave portion CNC.

Referring to FIG. 4 and FIG. 6, the second subpixel SP2 and the third subpixel SP3 can include the above-described single sloped surface structure. Accordingly, the second subpixel SP2 and the third subpixel SP3 can include the first light emitting area EA1, the second light emitting area EA2, the first non-light emitting area NEA1 and the second non-light emitting area NEA2 described above with reference to FIG. 4.

When the display device includes the first subpixel SP1 which emits blue light, the second subpixel SP2 which emits green light and the third subpixel SP3 which emits red light, the luminance of the first subpixel SP1 which emits blue light can be more significantly reduced in a sideward viewing angle direction, causing the display device to become yellowish in the sideward viewing angle direction. The inventors of the present disclosure have invented the display device in accordance with the embodiments of the present disclosure by finding that, when the double sloped surface structure is applied to the first subpixel SP1 which emits blue light and the single sloped surface structure is applied to the second subpixel SP2 which emits green light and the third subpixel SP3 which emits red light, it is possible to maximally suppress a display device from becoming yellowish in the sideward viewing angle direction.

The display device can include a substrate SUB. The substrate SUB can include a first substrate SUB1, an interlayer INTL and a second substrate SUB2.

The display device can include a first buffer layer BUF1 which is positioned on the substrate SUB. The first buffer layer BUF1 can include a multi-buffer layer MBUF and an active buffer layer ABUF.

A first active layer ACT1 can be positioned on the active buffer layer ABUF. A first gate insulating film GI1 can be positioned on the first active layer ACT1. A first interlayer dielectric film ILD1 can be positioned on the first gate insulating film GI1. A second buffer layer BUF2 can be positioned on the first interlayer dielectric film ILD1. A second gate insulating film GI2 can be positioned on the second buffer layer BUF2. A second interlayer dielectric film ILD2 can be positioned on the second gate insulating film GI2. The planarization layer PLN can be positioned on the second interlayer dielectric film ILD2.

The planarization layer PLN can include a third planarization layer PLN3, a first planarization layer PLN1 which is positioned on the third planarization layer PLN3 and a second planarization layer PLN2 which is positioned on the first planarization layer PLN1.

The display device can include various metal layers and circuit elements.

A first bottom metal layer BML1 can be positioned on the second substrate SUB2. The first bottom metal layer BML1 can be positioned to overlap a first transistor TR1, and can be positioned below the first transistor TR1.

The first transistor TR1 can include a first source electrode S1, a first drain electrode D1, a first gate electrode G1 and the first active layer ACT1.

A second transistor TR2 can include a second source-drain electrode SD2, a second gate electrode G2 and a second active layer ACT2.

A capacitor Cst can include a first plate PLT1 and a second plate PLT2.

Each display device in accordance with all embodiments of the present disclosure can be a touch display device. An example of such a touch display device is discussed referring to FIG. 7.

Figure 7:
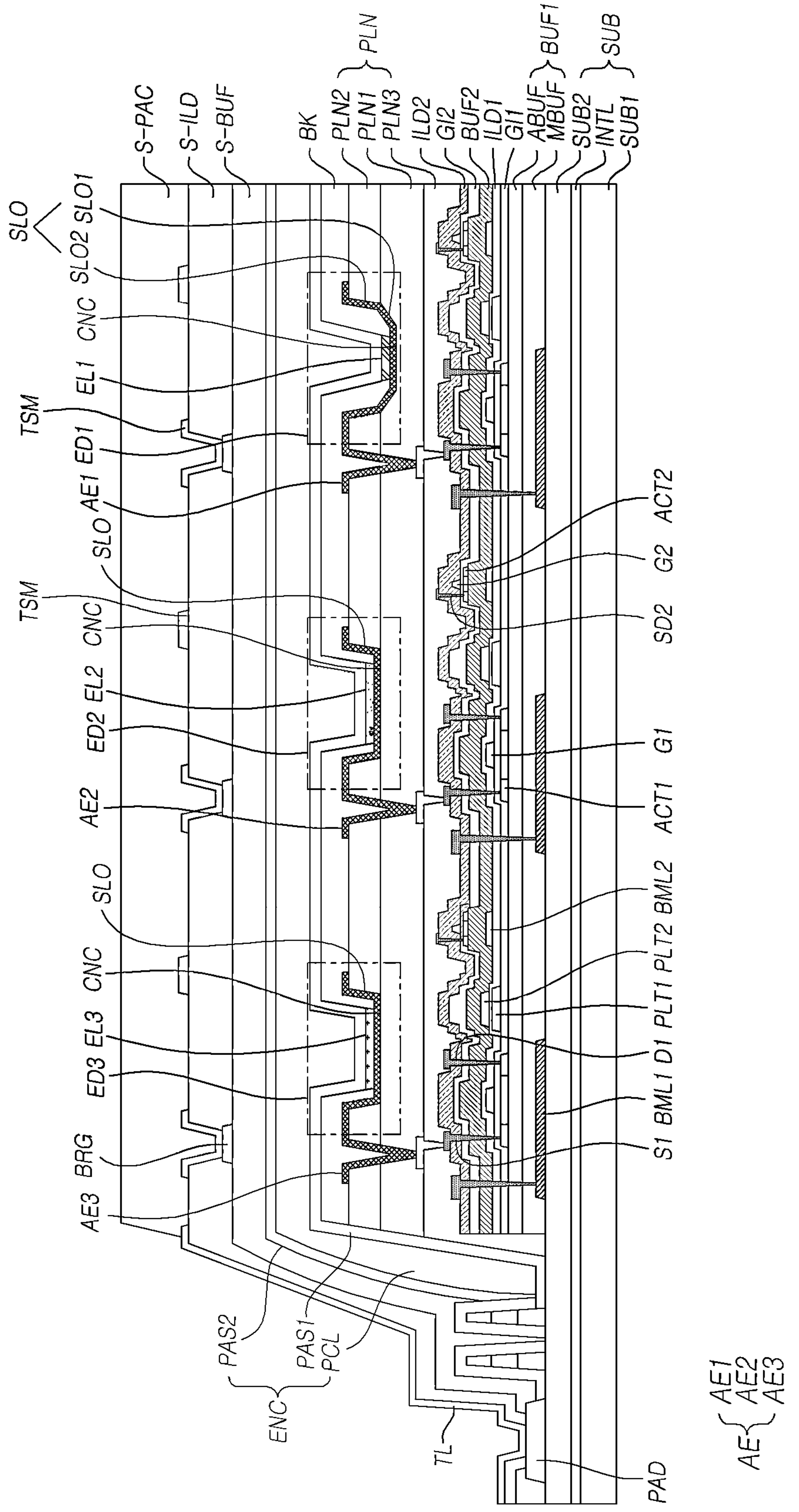

FIG. 7 is a cross-sectional view of a display device in accordance with embodiments of the present disclosure. In detail, FIG. 7 is a cross-sectional view of a pad part PAD and a display area of a touch display device in accordance with embodiments of the present disclosure.

Referring to FIG. 7, the display device can include a touch sensor metal TSM which is positioned on an anode electrode AE. The touch sensor metal TSM can be positioned in the display area of the display device, and can be disposed in a mesh form, for example.

The touch sensor metal TSM can be positioned not to overlap a sloped surface SLO. Further, the touch sensor metal TSM can be positioned not to overlap a second sloped surface SLO2. As the touch sensor metal TSM is positioned not to overlap the second sloped surface SLO2, the display device can have excellent light efficiency.

The display device can include an encapsulation layer ENC which is positioned on light emitting elements ED1, ED2 and ED3. The encapsulation layer ENC can include a first passivation layer PAS1, an organic encapsulation layer PCL which is positioned on the first passivation layer PAS1 and a second passivation layer PAS2 which is positioned on the organic encapsulation layer PCL.

The touch sensor metal TSM can be positioned over the encapsulation layer ENC. Such a structure in which the touch sensor metal TSM is positioned over the encapsulation layer ENC can be referred to as a touch sensor on encapsulation (TOE) structure.

A touch buffer layer S-BUF, a touch insulating film S-ILD and a touch protection layer PAC can be positioned on the encapsulation layer ENC. A bridge BRG can be positioned on the touch buffer layer S-BUF. The bridge BRG can contact the touch sensor metal TSM.

The display device can include a touch line TL. The touch line TL can transfer a touch signal received through the touch sensor metal TSM.

A brief description of examples of one or more embodiments of the present disclosure described above is as follows.

A display device 100 can include a first light emitting area EA1, a second light emitting area EA2, a third light emitting area EA3, a first non-light emitting area NEA1 and a second non-light emitting area NEA2. The second light emitting area EA2 can be positioned outside the first light emitting area EA1, and can be positioned to be spaced apart from the first light emitting area EA1. The third light emitting area EA3 can be positioned outside the second light emitting area EA2, and can be continuously positioned in contact with the second light emitting area EA2. The second non-light emitting area NEA2 can be positioned between the first light emitting area EA1 and the second light emitting area EA2. The first non-light emitting area NEA1 can be positioned outside the third light emitting area EA3.

The second light emitting area EA2 can have a shape corresponding to the shape of the edge of the first light emitting area EA1.

The third light emitting area EA3 can have a shape corresponding to the shape of the edge of the second light emitting area EA2.

A width w1 of the second light emitting area EA2 can be larger than a width w2 of the third light emitting area EA3.

The area of the second light emitting area EA2 can be larger than the area of the third light emitting area EA3.

The luminance of the third light emitting area EA3 can be larger than the luminance of the second light emitting area EA2.

The display device 100 can include a planarization layer PLN, an anode electrode AE which is positioned on the planarization layer PLN and a light emitting layer EL which is positioned on the anode electrode AE. The planarization layer PLN can include a concave portion CNC, a first sloped surface SLO1 which is positioned outside the concave portion CNC and a second sloped surface SLO2 which is positioned outside the first sloped surface SLO1.

The second light emitting area EA2 can be positioned in correspondence to the first sloped surface SLO1, and the third light emitting area EA3 can be positioned in correspondence to the second sloped surface SLO2.

An angle θ2 formed between the second sloped surface SLO2 and the concave portion CNC can be larger than an angle θ1 formed between the first sloped surface SLO1 and the concave portion CNC.

The planarization layer PLN can include a first planarization layer PLN1 and a second planarization layer PLN2 which is positioned on the first planarization layer PLN1. The first planarization layer PLN1 can include the first sloped surface SLO1, and the second planarization layer PLN2 can include the second sloped surface SLO2.

A height h2 of the second sloped surface SLO2 can be larger than a height h1 of the first sloped surface SLO1.

The display device 100 can include a first subpixel SP1 which emits blue light, a second subpixel SP2 which emits green light and a third subpixel SP3 which emits red light. The first subpixel SP1 can include the first light emitting area EA1, the second light emitting area EA2, the third light emitting area EA3, the first non-light emitting area NEA1 and the second non-light emitting area NEA2.

In the first subpixel SP1, the planarization layer PLN can include a concave portion CNC, a first sloped surface SLO1 and a second sloped surface SLO2.

In the second subpixel SP2 and the third subpixel SP3, the planarization layer PLN can include a concave portion CNC and a sloped surface SLO which is positioned outside the concave portion CNC.

The display device 100 can include a touch sensor metal TSM which is positioned on the anode electrode AE. The touch sensor metal TSM can be positioned not to overlap the second sloped surface SLO2.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present disclosure. The above description and the accompanying drawings provide an example of the technical idea of the present disclosure for illustrative purposes only. For example, the disclosed embodiments are intended to illustrate the scope of the technical idea of the present disclosure.

What is claimed is:

1. A display device comprising:
- a first light emitting area;
- a second light emitting area positioned outside the first light emitting area, and positioned to be spaced apart from the first light emitting area;
- a third light emitting area positioned outside the second light emitting area, and continuously positioned in direct contact with the second light emitting area;
- a second non-light emitting area positioned between the first light emitting area and the second light emitting area; and
- a first non-light emitting area positioned outside the third light emitting area.

2. The display device of claim 1, wherein the second light emitting area has a shape corresponding to a shape of an edge of the first light emitting area.

3. The display device of claim 1, wherein the third light emitting area has a shape corresponding to a shape of an edge of the second light emitting area.

4. The display device of claim 1, wherein a width of the second light emitting area is larger than a width of the third light emitting area.

5. The display device of claim 4, wherein a size of an area of the second light emitting area is greater than a size of an area of the third light emitting area.

6. The display device of claim 1, wherein a luminance of the third light emitting area is greater than a luminance of the second light emitting area.

7. The display device of claim 1, further comprising:
- a planarization layer including a concave portion, a first sloped surface positioned outside the concave portion, and a second sloped surface positioned outside the first sloped surface;

an anode electrode positioned on the planarization layer; and a light emitting layer positioned on the anode electrode.

8. The display device of claim 7, wherein the second light emitting area is positioned in correspondence to the first sloped surface of the planarization layer, and the third light emitting area is positioned in correspondence to the second sloped surface of the planarization layer.

9. The display device of claim 7, wherein an angle formed between the second sloped surface and the concave portion of the planarization layer is greater than an angle formed between the first sloped surface and the concave portion of the planarization layer.

10. The display device of claim 7, wherein the planarization layer includes a first planarization layer and a second planarization layer positioned on the first planarization layer, and the first planarization layer includes the first sloped surface, and the second planarization layer includes the second sloped surface.

11. The display device of claim 7, wherein a height of the second sloped surface of the planarization layer is greater than a height of the first sloped surface of the planarization layer.

12. The display device of claim 1, further comprising:

a first subpixel configured to emit blue light;

a second subpixel configured to emit green light; and a third subpixel configured to emit red light, wherein the first subpixel includes the first light emitting area, the second light emitting area, the third light emitting area, the first non-light emitting area and the second non-light emitting area.

13. The display device of claim 12, further comprising:

in the first subpixel, a planarization layer including a concave portion, a first sloped surface positioned outside the concave portion and a second sloped surface positioned outside the first sloped surface;

in the second subpixel and the third subpixel, a planarization layer including a concave portion and a sloped surface positioned outside the concave portion of the planarization layer in the second and third subpixels;

an anode electrode positioned on the planarization layers; and a light emitting layer positioned on the anode electrode.

14. The display device of claim 12, further comprising:

a planarization layer including a concave portion, a first sloped surface positioned outside the concave portion, and a second sloped surface positioned outside the first sloped surface;

an anode electrode positioned on the planarization layer; and a touch sensor metal positioned on the anode electrode, wherein the touch sensor metal is positioned not to overlap the second sloped surface of the planarization layer.

15. A display device comprising:

a first light emitting area;

a second light emitting area positioned outside the first light emitting area, and positioned to be spaced apart from the first light emitting area;

a third light emitting area positioned outside the second light emitting area, and continuously positioned in contact with the second light emitting area;

a second non-light emitting area positioned between the first light emitting area and the second light emitting area;

a first non-light emitting area positioned outside the third light emitting area;

a planarization layer including a concave portion, a first sloped surface which is positioned outside the concave portion and a second sloped surface which is positioned outside the first sloped surface;

an anode electrode positioned on the planarization layer; and a light emitting layer positioned on the anode electrode, wherein, the second sloped surface is in direct contact with the first sloped surface.

* * * * *